United States Patent [19]

Pulluru et al.

[11] Patent Number: 5,168,246
[45] Date of Patent: Dec. 1, 1992

[54] ERROR AMPLIFIER FOR MULTIPLE FREQUENCY OSCILLATOR CONTROL

[75] Inventors: Kishan R. Pulluru, Willowbrook; Gopal K. Srivastava, Arlington Heights, both of Ill.

[73] Assignee: Zenith Electronics Corporation, Glenview, Ill.

[21] Appl. No.: 783,446

[22] Filed: Oct. 24, 1991

[51] Int. Cl.[5] ............... H03L 7/093; H04N 5/05
[52] U.S. Cl. .............................. 331/8; 331/10; 331/15; 331/17; 331/20; 331/25; 358/158
[58] Field of Search .............. 331/8, 10, 15, 17, 25, 331/20; 358/158, 159

[56] References Cited

U.S. PATENT DOCUMENTS 4,568,888 2/1986 Kimura et al. ............... 331/17 X

*Primary Examiner*—Siegfried H. Grimm

[57] ABSTRACT

A multiple frequency scan oscillator control system includes a phase locked loop operative upon a scan oscillator to provide phase and frequency synchronization thereof to a periodic reference signal. A static phase error correction is operative to provide adjustment of the free-running or static frequency of the scan oscillator. An error amplifier includes a pair of intercoupled differential amplifier configurations one having a constant current source and the other having a frequency dependent current source which responds to a frequency dependent bias current to alter amplifier gain. A threshold detection circuit includes a differential amplifier pair coupled to a pair of switching circuits for establishing a threshold action in response to system error voltage to indicate large magnitude error voltages and signal the need for free-running frequency adjustment of the oscillator.

8 Claims, 3 Drawing Sheets

ERROR AMPLIFIER FOR MULTIPLE FREQUENCY OSCILLATOR CONTROL

CROSS REFERENCE TO RELATED APPLICATION

This application is related to a copending application entitled MULTIPLE FREQUENCY RANGE OSCILLATOR AND CONTROL, Ser. No. 07/709,939, filed Jun. 4, 1991 which is assigned to the assignee of this application and which is hereby incorporated herein by reference.

FIELD OF THE INVENTION

This invention relates generally to television receivers and computer monitors and relates particularly to the synchronization and control of display scan systems therein.

BACKGROUND OF THE INVENTION

Several different types of television broadcast formats and standards are used in different locales throughout the world. Two of the most pervasive are the system used in the United States of America known as NTSC (National Television Standards Committee) and the European system known as PAL (Phase Alternating Line). In addition, several systems for providing increased picture resolution or definition, generally referred to as HDTV (High Definition Television) have been and are continuing to be developed.

While the television receivers operating in these varied systems are equally varied, certain aspects remain generally similar. For example, most television receivers include circuitry for selecting the desired television signal from among a plurality of broadcast signals available, a signal processing system which recovers the picture and sound information from the broadcast signal, systems for sequentially scanning a display device such as a cathode ray tube in both horizontal and vertical directions, and scan synchronization systems operative upon the display to coordinate display scanning to the picture and sound information.

Despite significant differences between the signal selection and signal processing functions of television receivers operating in accordance with the above-mentioned variety of broadcast systems, the functions of display scanning and synchronization are generally quite similar. Generally, picture and sound information together with scan synchronizing signals are modulated upon a broadcast carrier at the transmitter. At the receiver, the scan synchronizing signals are separated from the remainder of the picture and sound information and used to control locally generated horizontal and vertical scan signals. The latter are used to drive the display scanning circuits of the display system.

Computer monitors and many video game devices are also similar to television receivers in that a display system, such as a cathode ray tube, is scanned in synchronism with picture information. In such systems, the scan signals are computer generated and are used to synchronize display scan and picture information in much the same manner as television receivers.

Because the horizontal scan oscillator control used in the variety of television receivers, computer monitors, and video game displays are substantially identical in overall function, it would seem beneficial to provide a single scan oscillator control system which may be used in all or many of such display devices. In effect, this would produce a "universal" scan oscillator control system. Such a universal system, however, is required to perform in accordance with a broad range of scan frequencies. As is well known, the operation of the display system synchronization controlling the horizontal scan oscillator is extremely demanding. Meeting these needs is made particularly challenging by the requirement for precise control of both frequency and phase of the horizontal scan oscillator. Generally speaking, attempts to maintain frequency control over a broad range of reference scan frequencies has led to systems which lack stable precise phase control. Conversely, highly precise stable phase locking systems have generally lacked the ability to accommodate a wide range of frequencies.

For example, one of the most common and pervasive horizontal oscillator control systems used in television receivers, computer monitors, or video games is generally referred to as a phase locked loop. While a variety of different phase locked loop systems have been developed, the prior art system shown in FIG. 1 is typical and provides a helpful basis for understanding the basic problems associated with horizontal oscillator control.

Thus, with reference to FIG. 1, a typical phase locked loop system is constructed in accordance with the prior art and generally referenced by numeral 10. A sync signal separator 12 operates in accordance with conventional fabrication techniques to extract the horizontal scan synchronizing signals from the remainder of the received television signal to provide a reference signal input to a conventional phase detector 11. Phase detector 11 includes a pair of inputs 13A coupled to sync separator 12 and 13B coupled to the horizontal drive signal. Phase detector 11 produces an output signal representative of the difference between inputs 13A and 13B. The output of phase detector 11 is coupled to a low pass filter 16 which in turn is coupled to an error amplifier 17. A voltage controlled oscillator 18 having an output frequency determined in part by the error signal applied by error amplifier 17 produces a periodic output signal which is coupled to a frequency divider 19. The output of frequency divider 19 is applied to input 13B of phase detector 11 and to the horizontal scan system.

In operation, phase detector 11 compares the output signal of frequency divider 19 to the reference synchronizing signals at input 13A. An error voltage indicative of the difference therebetween is filtered by low pass filter 16 and amplified by error amplifier 17 to produce a controlling voltage for voltage controlled oscillator 18. In the event voltage controlled oscillator 18 is precisely synchronized to the referenced synchronizing signals at input 13A, the output voltage of phase detector 11 is zero and the frequency of voltage controlled oscillator 18 remains unchanged. In practice, however, this condition seldom exists and, more typically, the frequency of voltage controlled oscillator 18 differs from that of the incoming reference signals. If the difference between oscillator 18 and the reference signals detected by phase detector 11 is a phase difference or minor frequency difference, the error voltage coupled to oscillator 18 by filter 16 and amplifier 17 causes oscillator 18 to change frequency in the direction which brings its output signal toward synchronization with the reference sync signals. It has been found that prior art systems of the type shown in FIG. 1 respond well to minor variations of phase and frequency between oscillator 18 and the reference synchronizing signals.

If, however, a substantial frequency difference exists between the frequency of signals produced by oscillator 18 and the reference synchronizing signals, a correspondingly large error voltage is produced by phase detector 11 which is amplified by error amplifier 17 to produce a substantial change of frequency in voltage control oscillator 18. As is well known, conventional phase locked loop systems respond to large frequency differences by reaching an equilibrium point in which a sufficient error voltage is maintained by the phase detector to provide the necessary control of the oscillator. This equilibrium results in a condition in which the frequency of oscillator 18 is synchronized to that of the incoming reference sync signals while a phase difference or phase error between oscillator output signals and sync signals remains. This phase error is referred to in the art as static phase error. In systems of the type shown in FIG. 1, the ability of the system to make large frequency compensations is accompanied by correspondingly large static phase errors. Thus, practitioners in the art generally must compromise system performance to provide the necessary frequency compensation characteristic at the expense of static phase error. With this understanding of the basic phase locked loop control system of the type shown in FIG. 1, it becomes apparent that an improved system is required if a broad range of scan frequencies is to be accommodated by a single scan oscillator control system.

Accordingly, it is general object of the present invention to provide an improved horizontal scan oscillator control system. It is a more particular object of the present invention to provide an improved oscillator control system which accommodates a broad range of scan frequencies.

BRIEF DESCRIPTION OF THE DRAWINGS

The features of the present invention, which are believed to be novel, are set forth with particularity in the appended claims. The invention, together with further objects and advantages thereof, may best be understood by reference to the following description taken in conjunction with the accompanying drawings, in the several figures of which like reference numerals identify like elements and in which:

DESCRIPTION OF THE PREFERRED EMBODIMENT

Figure 2:
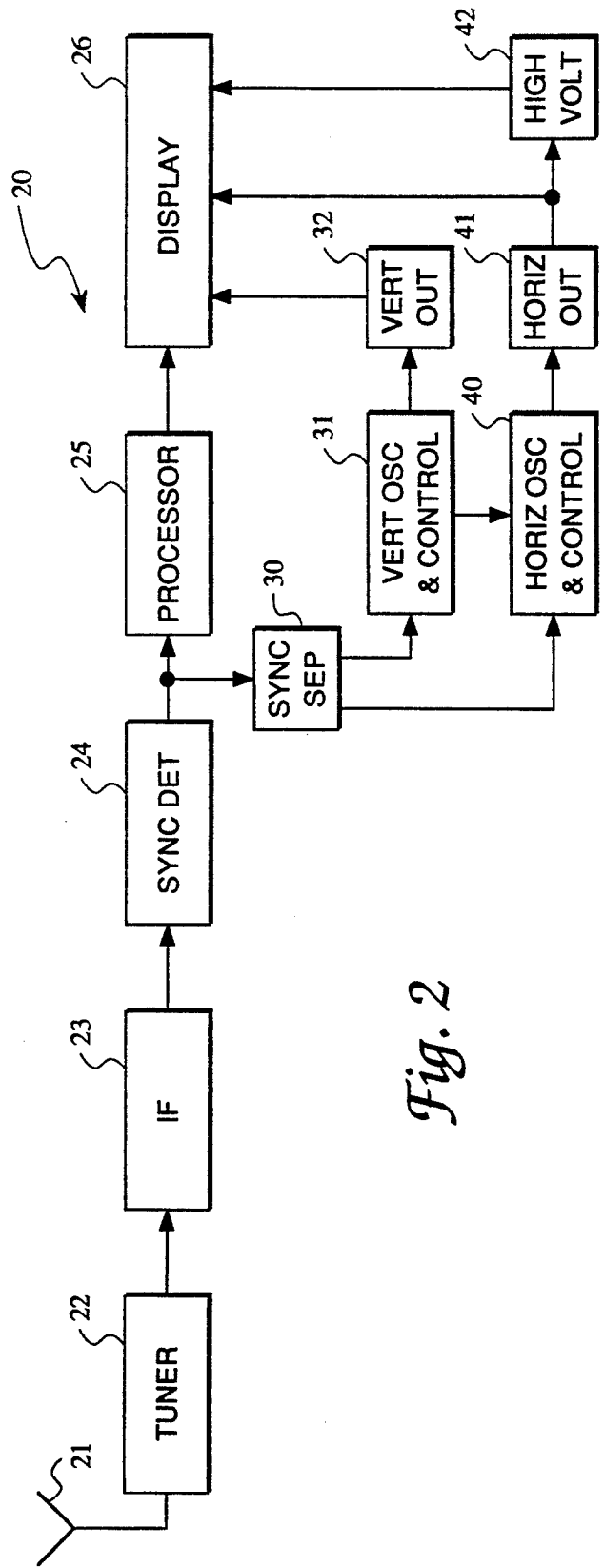
FIG. 2 sets forth a block diagram of a television receiver constructed in accordance with the present invention.

FIG. 2 sets forth a block diagram of a television receiver constructed in accordance with the present invention and generally referenced by numeral 20. Receiver 20 includes a receiving antenna 21 coupled to a tuner 22. Tuner 22 is coupled to an intermediate frequency system 23 which in turn is coupled to a synchronous detector 24. A signal processor 25 which includes conventional systems for processing picture and sound information is coupled to a display 26. A sync signal separator 30 is coupled to the output of synchronous detector 24. A vertical scan oscillator and control system 31 is coupled to sync separator 30 and a vertical output amplifier 32. The latter is coupled to display 26. A horizontal scan oscillator and control system 40 is coupled to sync separator 30 and a horizontal output amplifier 41. The latter is coupled to display 26 and a high voltage generator 42. High voltage generator 42 produces the high voltage potential required for display 26.

In operation, antenna 21 receives one or more broadcast television signals which are applied to tuner 22. Tuner 22 includes conventional channel selection systems for selecting the desired one of the plurality of signals received by an antenna 21 and for converting the selected signal to an intermediate frequency signal which is further processed by intermediate frequency processor 23. Synchronous detector 24 operates upon the intermediate frequency signal to recover the picture, sound, and scan synchronizing signals modulated thereon. The picture information is further processed by signal processor 25 to produce appropriate picture information signals to control display 26.

Sync separator 30 extracts the vertical and horizontal scan synchronizing signals from the composite signal at the output of synchronous detector 24 and applies them to vertical scan oscillator and control 31 and to horizontal scan oscillator and control 40. In response to the applied vertical scan signals from sync separator 30, vertical oscillator and control 31 produces a synchronized vertical scan signal which is amplified by vertical scan output system 32 and applied to display 26 to produce the vertical scan thereof. By means set forth below in greater detail and in accordance with the present invention, horizontal scan oscillator and control 40 produces a horizontal scan signal which is synchronized to the horizontal sync signals provided by sync separator 30. This output signal is further amplified by horizontal output 41 and applied to display 26 to produce the synchronized horizontal scan of display 26. In addition, high voltage system 42 responds to the output signal of horizontal output 41 to produce a high voltage operating potential for display 26.

With the exception of horizontal scan oscillator and control 40, television receiver 20 may be constructed in accordance with virtually any of the known conventional fabrication techniques. Conversely, horizontal scan oscillator and control 40, described below and in the above-referenced copending application in greater detail, functions in accordance with the present invention to produce horizontal scan signals which are maintained in frequency and phase synchronization to the reference horizontal sync signals over a wide range of scan frequencies. In addition, horizontal scan oscillator and control 40 avoids the above-described objectionable performance compromises which would be required in prior art systems to meet a broad spectrum of scan frequencies.

It should be apparent to those skilled in the art that while the environment in which the present invention horizontal scan oscillator and control is situated in FIG. 2 is that of a television receiver, the present invention may be used with equal benefit in a variety of environments such as computer monitors and video game displays or other display systems.

Figure 3:
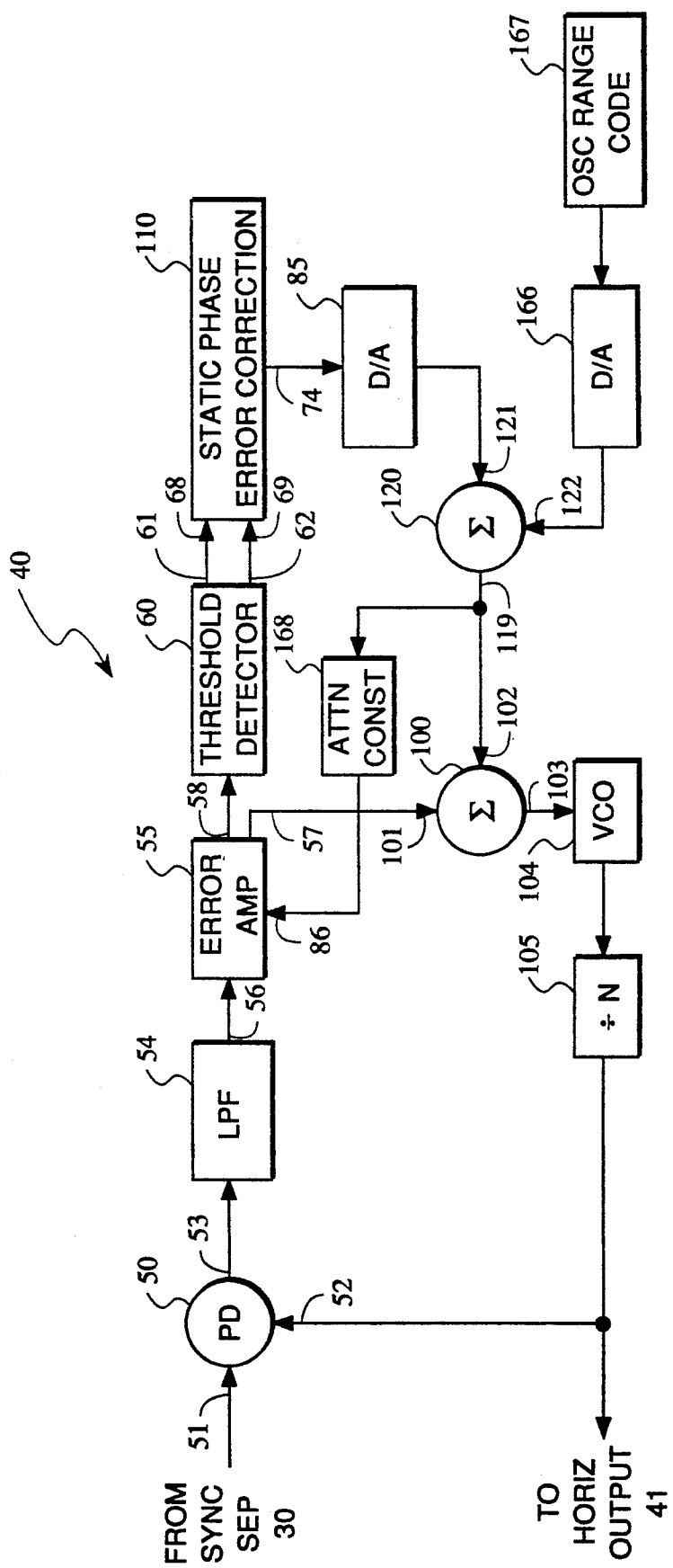
FIG. 3 sets forth a block diagram of an improved scan oscillator control constructed in accordance with the present invention.

FIG. 3 sets forth a block diagram of a horizontal scan oscillator and control generally referenced by numeral 40. A phase detector 50 which may be constructed in accordance with conventional fabrication techniques, includes an input 51 coupled to sync separator 30 (seen in FIG. 2), an input 52 and an output 53. A low pass filter 54 is coupled to phase detector output 53. An error amplifier 55 is constructed in accordance with the present invention and is described below in greater detail. Error amplifier 55 includes an error signal input 56 coupled to the output of low pass filter 54 and a pair of outputs 57 and 58. Error amplifier 55 further includes a bias current input 86. A summing network 100 includes an input 101 coupled to output 57 of error amplifier 55, an input 102 and an output 103. A voltage controlled oscillator 104 includes an error signal input coupled to output 103 of summing network 100 and an output 15 coupled to a frequency divider 105. The latter is coupled to horizontal output 41 (seen in FIG. 2) and to input 52 of phase detector 50.

A threshold detector 60 is coupled to output 58 of error amplifier 55 and includes a pair of outputs 61 and 62. A static phase error correction circuit constructed in accordance with the above-referenced copending application referenced by numeral 110 includes a pair of inputs 68 and 69 coupled to outputs 61 and 62 respectively of threshold detector 60. Static phase error correction circuit 110 includes an output 74 coupled to a digital-to-analog converter 85. A summing network 120 includes a input 121 coupled to the output of digital-to-analog converter 85, an input 122, and an output 119. Output 119 of summer 120 is coupled to bias input 86 of error amplifier 55 by an attenuation network 168. Output 119 of summer 120 is further coupled to input 102 of summing network 100. An oscillator range code number source 167 constructed in accordance with the above-referenced copending application is coupled to a digital-to-analog converter 166, the output of which is coupled to input 122 of summer 120.

Figure 1:
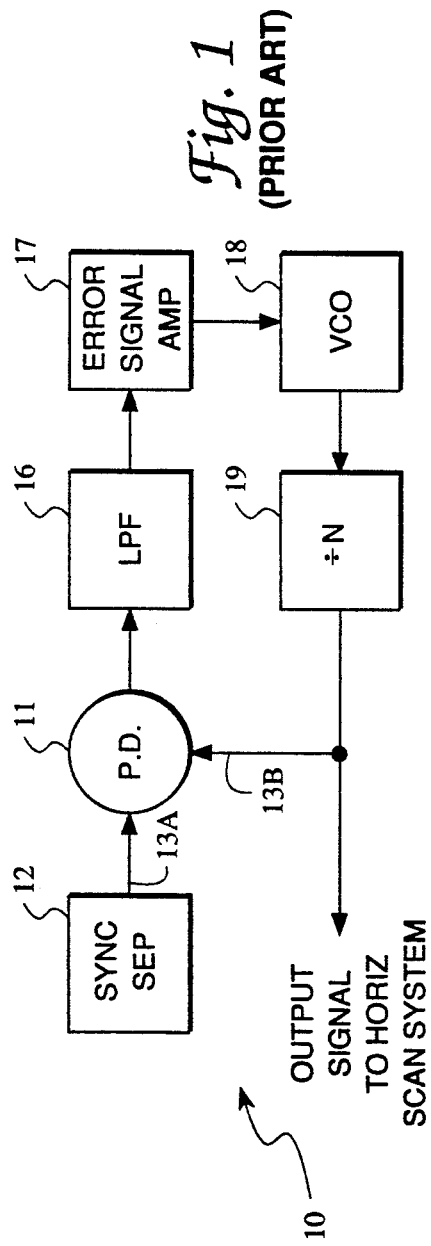
FIG. 1 sets forth a typical prior art phase locked loop system.

In operation and by way of overview, the function of the system shown in FIG. 3 is believed best understood by initially noting that, but for the response of error amplifier 55 to the bias current input and input 86, the combination of phase detector 50, low pass filter 54, error amplifier 55, voltage controlled oscillator 104 and frequency divider 105 may be initially considered as forming a phase locked loop similar to the prior art phase locked loop shown in FIG. 1. Thus, in similarity to prior art phase locked loops, this loop responds to minor or short duration changes of oscillator frequency or phase in a generally conventional manner. Summing network 100 and the remaining components shown in FIG. 3 provide additional system performance not found in prior art systems which includes the ability of error amplifier 55 to maintain linear phase locked loop sensitivity over a broad spectrum of scan frequencies and the ability of threshold detector 60 to provide the input error voltage signals required by static phase error correction 110.

Specifically, phase detector 50 receives reference horizontal sync signals from sync separator 30 (seen in FIG. 2) and a sample of the frequency divided output of oscillator 104. In accordance with conventional fabrication techniques, phase detector 50 produces an error signal at output 53 which is coupled by low pass filter 54 to the input of error amplifier 55. Amplifier 55 imposes a signal gain upon the applied error signal which in the manner described below is a function of the scan signal frequency being processed. This amplified error signal is operative upon voltage controlled oscillator 104 to shift the frequency of oscillation thereof. In accordance with conventional fabrication techniques, voltage controlled oscillator 104 is operated at a predetermined multiple of the desired horizontal scan frequency. Thus, the output signal of voltage controlled oscillator 104 is frequency divided by this predetermined frequency multiple to produce the desired horizontal scan output signal. The latter is coupled to phase detector input 52 and to horizontal output system 41 (seen in FIG. 2). Thus, temporary or minor changes of frequency or phase between the sample of frequency divided oscillator output signal at input 52 of phase detector 50 and reference synchronizing signals at input 51 produce appropriate error voltages at output 53 which are amplified and applied to oscillator 104 to adjust the frequency of oscillator 104 until the frequency divided oscillator signal again corresponds in frequency and phase to the reference sync pulses.

The ability of the phase locked loop formed by phase detector 50, low pass filter 54, error amplifier 55, voltage controlled oscillator 104 and frequency divider 105 to properly maintain precise frequency and phase synchronization is largely dependent upon two operating criteria. The first criteria is the establishment of the correct free-running frequency for voltage controlled oscillator 104 while the second criteria involves the establishment of the correct gain of amplifier 55 together with the sensitivity of voltage controlled oscillator 104 to the amplified error signal. In order for the system of FIG. 3 to properly perform at multiple scan frequencies, both criteria must be optimized as a function of scan frequency. In other words, the system of FIG. 3 must establish these criteria for each selected scan frequency in order to properly accommodate a variety a scan frequencies.

The first criteria is optimized by threshold detector 60, static phase error correction 110 and digital-to-analog converter 85, the operations of which are set forth in the above-referenced copending patent application in greater detail. However, suffice it to note here that threshold detector 60 produces output voltages at either outputs 61 or 62 solely in response to error voltage amplitudes indicative of a substantial frequency correction requirement. Output 61 is indicative of an oscillator frequency which is too low and is coupled to input 68 of static phase error correction 110. Conversely, output 62 is indicative of an oscillator frequency which is too high and is coupled to input 69 of static phase error correction 110. Static phase error correction 110 produces a digitally encoded output signal at output 74 which is adjusted solely in response to the occurrence of significant magnitude inputs at inputs 68 or 69 which exist for a predetermined length of time. Digital-to-analog converter 85 converts the output digitally encoded signal of static phase error correction 110 to an analog current which is applied to one input of summing network 120. The remaining input of summing network 120 is provided by oscillator range code number circuit 167 which, in accordance with the above-referenced copending patent application, produces a digitally encoded number indicative of the frequency range which includes the to-be-selected scan frequency. Digital-to-analog converter 166 converts this digitally encoded oscillator range code number to an analog current which is applied to the remaining input of summer 120. Thus, the currents supplied by static phase error correction 110 and oscillator range code number source 167 are combined to provide a bias current which is applied to voltage controlled oscillator 104 through summer 100. The bias current supplied by summer 120 is a relatively stable bias current which, in essence, establishes the steady state or free-running frequency of voltage controlled oscillator 104. Thus, with the steady state or free-running frequency of oscillator 104 established by the biased current from summer 120. the error signal supplied by error amplifier 55 at input 101 of summer 100 combines with this bias current to provide dynamic or short term frequency adjustment of voltage controlled oscillator 104. As a result, the appropriate free-running frequency of oscillator 104 is established for each scan frequency of operation.

The second criteria for proper operation of the system of FIG. 3 is optimized by the action of error amplifier 55 in response to the bias signal applied at input 86. The detailed operation of error amplifier 55 is set forth below in greater detail in connection with FIG. 4. However, suffice it to note here that the gain of error amplifier 55 is controlled in response to the bias signal applied at input 86. Thus, as the above-mentioned operation of static phase error correction 110 and oscillator range code number source 167 provide a free-running frequency bias current for oscillator 104 in accordance with the selected frequency, a corresponding frequency dependent bias signal is coupled therefrom to input 86 of error amplifier 55 by attenuation network 168 to correspondingly adjust the gain of error amplifier 55.

The frequency dependent gain adjustment of error amplifier 55 is required to compensate for the nonlinearity of response to control signal provided by voltage controlled oscillator 104. Simply stated, most economically feasible voltage controlled oscillators exhibit a substantial change of sensitivity to frequency control signals at different frequencies. In most voltage controlled oscillators such as oscillator 104, the sensitivity or responsiveness of the oscillator frequency to control signal diminishes as frequency is increased. Thus, to obtain any given frequency adjustment, a greater amplitude of control signal is required as oscillator frequency is increased. Correspondingly, the gain characteristic of error amplifier 55 is increased as a direct function of frequency increase to provide a compensating change and maintain a generally linear phase locked loop sensitivity.

Figure 4:
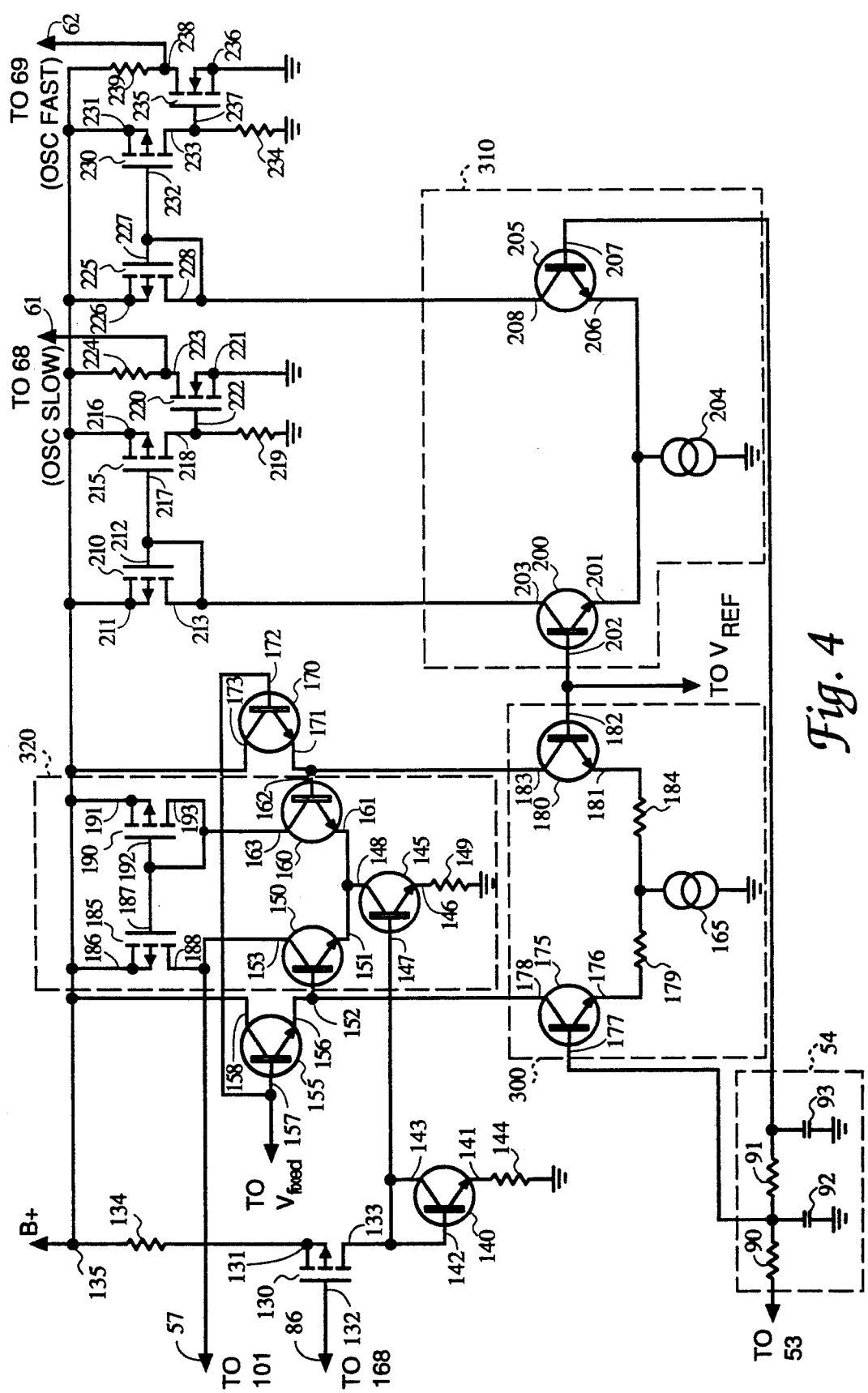
FIG. 4 sets forth a schematic diagram of an error amplifier constructed in accordance with the present invention.

FIG. 4 sets forth a schematic diagram of error amplifier 55 and threshold detector 60. A field effect transistor 130 includes a source electrode 131 coupled to a B-plus terminal 135 by a resistor 134, a gate electrode 132 coupled to input terminal 86 which in turn is coupled to attenuation circuit 168 (seen in FIG. 3) and a drain electrode 133. An NPN transistor 140 includes an emitter 141 coupled to ground by a resistor 144, a base 142 coupled to drain 133 of transistor 130, and a collector 133 also coupled to drain 133 of transistor 130. A low pass filter 54 shown in dashed line enclosure includes a series coupled pair of resistors 90 and 91 having a capacitor 92 coupled to ground from the junction therebetween. A capacitor 93 is further coupled from the remaining side of resistor 91.

An NPN transistor 175 includes an emitter 176 coupled to a constant current source 165 by resistor 179, a base 177 coupled to the junction of resistors 90 and 91, and a collector 178. An NPN transistor 180 includes an emitter 181 coupled to constant current source 165 by a resistor 184, a base 182 coupled to a source of reference bias voltage, and a collector 183. A NPN transistor 145 includes an emitter 146 coupled to ground by a resistor 149, a base 147 coupled to collector 143 and base 142 of transistor 140. A NPN transistor 150 includes an emitter 151 coupled to collector 148, a base 152 coupled to collector 178 and a collector 153 coupled to output terminal 57 which in turn is coupled to input 101 of summer 100 (seen in FIG. 3). A NPN transistor 155 includes an emitter 156 coupled to base 152, a base 157 coupled to a fixed voltage source, and a collector 158 coupled to B-plus supply 135. A field effect transistor 185 includes a source electrode 186 coupled to supply 135, a gate electrode 187, and a drain electrode 188 coupled to collector 153 of transistor 150.

An NPN transistor 160 includes an emitter 161 coupled to emitter 151, a base 162 coupled to collector 183, and a collector 163. An NPN transistor 170 includes an emitter 171 coupled to base 162, a base 172 coupled to base 157 of transistor 155, and a collector 173 coupled to supply 135. A field effect transistor 190 includes a source electrode 191 coupled to supply 135, a gate electrode 192 coupled to gate electrode 187 and a drain electrode 193 coupled to collector 163 and to gate electrode 192.

An NPN transistor 200 includes an emitter 201 coupled to ground by a constant current source 204, a base 202 coupled to base 182 of transistor 180, and a collector 203. An NPN transistor 205 includes an emitter 206 coupled to constant current source 204, a base 207 coupled to the junction of resistor 91 and capacitor 93 in low pass filter 54 and a collector 208. A field effect transistor 210 includes a source electrode 211 coupled to supply 135, a gate electrode 212, and a drain electrode 213 coupled to collector 203 and gate electrode 212. A field effect transistor 215 includes a source electrode 216 coupled to supply 135, a gate electrode 217 coupled to gate electrode 212, and a drain electrode 218 coupled to ground by a resistor 219. A field effect transistor 220 includes a source electrode 221 coupled to ground, a gate electrode 222 coupled to drain electrode 218, and a drain electrode 223 coupled to supply 135 by a resistor 224. Drain electrode 223 is further coupled to output terminal 61, which as is better seen in FIG. 3, is coupled to input 68 of static phase error correction 110.

A field effect transistor 225 includes a source electrode 226 coupled to operating supply, a gate electrode 227, and a drain electrode 228 coupled to collector 208 of transistor 205 and to gate electrode 227. A field effect transistor 230 includes a source electrode 231 coupled to supply 135, a gate electrode 232 coupled to gate electrode 227, and a drain electrode 233 coupled to ground by a resistor 234. A field effect transistor 235 includes a source electrode 236 coupled to ground, a gate electrode 237 coupled to drain electrode 233 and a drain electrode 238 coupled to supply 135 by a resistor 239. Drain electrode 238 is further coupled to output terminal 62 which in turn is coupled to input 69 of static phase error correction 110 (seen in FIG. 3).

In operation, transistors 175 and 180 together with constant current source 165 form a differential amplifier configuration. Transistor 180 is coupled to a fixed reference voltage while transistor 175 is coupled to the error voltage input signal from low pass filter 54. When the applied error voltage signal is equal to the reference voltage, the conductions of transistors 175 and 180 are equal and the currents therethrough are approximately equal to one-half the current of constant source 165. In the event, however, the error voltage applied to transistor 175 differs in either direction from the reference voltage applied to transistor 180, a corresponding conduction difference occurs in the currents of transistors 175 and 180. Transistors 150 and 160 together with transistor 145 form an additional differential amplifier configuration coupled to transistors 175 and 180. Transistors 155 and 175 are coupled to a fixed voltage source and are utilized to provide collector loads for transistors 175 and 180 respectively and to provide bias for differential transistors 150 and 160. In essence, transistors 150 and 160 form a second balanced differential amplifier coupled to the differential amplifier formed by transistors 175, 180 and current source 165. In contrast, however, the current source for the differential pair of transistors 150 and 160 is formed by transistor 145 together with field effect transistor 130 and NPN transistor 140. This current source is not a constant current source but is configured specifically to vary in response to the signal applied to gate 132 of field effect transistor 130. It should be recalled that this input signal to gate 132 is, in fact, the frequency dependent bias current supplied by static phase error correction 110 and oscillator range code number 167 (seen in FIG. 3) to establish the free-running or static frequency of oscillator 104 (also seen in FIG. 3). Thus, the signal applied to transistor 130 is a frequency dependent signal and is amplified by transistors 130 and 140 to control the current source for differential amplifier pair 150 and 160 provided by the conduction of transistor 145.

Because the conduction level of the differential amplifier formed by transistors 150 and 160 is dependent upon the conduction of transistor 145, the frequency dependence of the current source provided by transistor 145 causes the gain of the differential amplifier formed by transistors 150 and 160 to be similarly frequency dependent.

Thus, as differential amplifier transistor pair 175 and 180 respond to variations of the applied error signal at base 177 of transistor 175 to alter the relative conductions of transistors 175 and 180, differential signals are applied to bases 152 and 162 of transistors 150 and 160. As a result, the relative conductions of transistors 150 and 160 are correspondingly changed producing an output signal at collector 153 of transistor 150 which comprises an amplified error signal which, as is shown, is coupled to input 101 of summing network 100 to provide a dynamic control current which is then applied to voltage controlled oscillator 104 for dynamic phase and frequency correction. It should be noted that the degree of amplification occurring between the input error signal at base 177 of transistor 175 and the output signal at collector 153 of transistor 150 is, in part, a function of the frequency dependent current in transistor 145. Thus, in its preferred form, the frequency dependent variation of gain provided by the error signal amplifier thus described in FIG. 4 is selected to compensate for the frequency dependent change of oscillator sensitivity to control signal input. For example, assuming oscillator 104 exhibits the typical loss of sensitivity to control signal with increased frequency which most voltage controlled oscillators exhibit, the frequency dependent gain characteristic of the present invention error amplifier is selected to provide increased error signal gain with increased frequency. Thus, a compensating effect is produced and the automatic phase control of the scan oscillator is substantially linearized over the broad spectrum of scan frequencies anticipated to meet the above-described frequency spectrum.

The circuit of FIG. 4 described thus far provides the operation of error amplifier 155 (seen in FIG. 3). The remainder of the circuit of FIG. 4 also responds to the input error voltage provided by phase detector 50 and low pass filter 54 and comprises threshold detector 60 (also seen in FIG. 3). By way of overview, it should be recalled that the function of threshold detector 60 is to provide output signals for static phase error correction 110 which are present only when the phase locked loop is exercising substantial frequency correction. The exercise of substantial frequency correction within the phase locked loop is attended by correspondingly large amplitude error voltages applied to the voltage controlled oscillator. Thus, the basic function of threshold detector 60 is to provide a pair of output signals which indicate error voltages within the phase locked loop in either direction which exceed a predetermined amplitude threshold. In accordance with the operation of static phase correction 110 described in the above-reference related application, these output signals are used to provide adjustment of the free-running or static frequency of the system scan oscillator.

Specifically, transistors 200 and 205 are commonly coupled to a constant current source 204 and thus form a differential amplifier configuration in which their relative conductions are controlled by the relative amplitudes of signals applied to their respective bases. Base 202 of transistor 200 is coupled to a fixed voltage reference source and thus is maintained constant. In contrast, base 207 of transistor 205 is coupled to low pass filter 54 which in turn is coupled to the error voltage output of phase detector 50 (seen in FIG. 3). Thus, the relative conductions of transistors 200 and 205 respond directly to the input error voltage applied to base 207 and produce corresponding relative currents in transistors 200 and 205. Because transistors 200 and 205 are commonly coupled to constant current source 204, it should be noted that while base 202 of transistor 200 is remained fixed in voltage, the conduction changes of transistor 205 caused by the applied error voltage signals are applied to emitter 201 of transistor 200 causing conduction thereof to also respond to the input signal at base 207.

Field effect transistors 210, 215 and 220 form a high gain switching circuit which responds to the current within transistor 200 to switch the output signal at output 61 between high and low voltage conditions. Correspondingly, field effect transistors 225, 230 and 235 form an identical high gain switching circuit which cooperate to switch the output signal at output 62 between high and low voltage conditions in response to the current within transistor 205. Thus, the basic function of the transistors 200 and 205 is to maintain outputs 61 and 62 in a low voltage condition until the error voltage at base 207 exceeds a predetermined threshold causing the corresponding one of inputs 61 or 62 to be switched to a high voltage signal condition.

Specifically, when the error voltage at base 207 of transistor 205 is equal to or close to the reference voltage at base 202 of transistor 200, transistors 200 and 205 conduct substantially equal currents. Correspondingly, the currents within transistors 200 and 205 develop gate voltages for transistors 215 and 230 respectively at gate electrodes 217 and 232 which establish the conduction levels of field effect transistors 215 and 230. With the conduction of field effect transistors 215 and 230, corresponding voltages are developed across resistors 219 and 234 respectively which are applied to gate electrodes 222 and 237 of field effect transistors 220 and 235 respectively. The size of resistors 219 and 234 are selected to provide gate voltages for transistors 220 and 235 which cause transistors 220 and 235 to conduct developing voltage drops across resistors 224 and 239. The size of resistors 224 and 239 is selected to provide sufficient voltage drop during conduction of transistors 220 and 235 to cause outputs 61 and 62 to assume low voltage conditions when transistors 220 and 235 conduct. In their preferred form, therefore, transistors 220 and 235 are configured as high gain switches which conduct heavily so long as the voltages at gates 222 and 237 remain above a predetermined switching level. Thus, so long as the error voltage applied to base 207 remains relatively close to the reference voltage at base 202 of transistor 200, sufficient conduction is maintained in transistors 200 and 205 to maintain both outputs 61 and 62 in a low voltage condition.

In the event the error voltage applied to base 207 departs substantially from the reference voltage at base 202 in either direction, the relative conductions of transistors 200 and 205 are shifted. For example, in the event the error voltage at base 207 of transistor 205 increases, the conduction of transistor 205 is correspondingly increased. Because of the differential coupling between transistors 205 and 200, a corresponding decrease of current within transistor 200 occurs. The increased conduction of transistor 205 does not affect output signal at output 62 since increased conduction of transistor 205 further increases the conduction of transistor 230 which, in turn, maintains the switched on or conductive condition of transistor 235 maintaining output 62 in a low voltage condition. In contrast, however, the decrease of conduction in transistor 200 raises the voltage at gate 217 of field effect transistor 215. This increased voltage causes reduced conduction of field effect transistor 215 which develops a reduced voltage cross resistor 219. As the error signal at base 207 further increases, the conduction of transistor 200 is further reduced which in turn further raises the voltage at gate electrode 217 decreasing the conduction of field effect transistor 215 and producing an reduced voltage across resistor 219. When the voltage across resistor 219 lowers gate electrode 222 of transistor 220 below the switching threshold, the conduction of field effect transistor 220 abruptly decreases which in turn raises the voltage at output 61 to a high voltage condition. Thus, output 62 remains low while output 61 is switched to a high voltage condition indicating an error voltage exceeding the established threshold.

Conversely, if the equilibrium provided by a voltage at base 207 close to the reference voltage at base 202 is disturbed in the opposite direction so as to decrease the voltage at base 207, the conduction of transistor 205 is decreased while the conduction of transistor 200 is increased. Once again, the increased conduction of transistor 200 as the equilibrium of the differential amplifier is disturbed does not alter the low voltage condition at output 61. However, the decreased conduction of transistor 205 causes the switching circuit provided by field effect transistors 225, 230 and 235 to be switched in the same manner described above to raise output 62 from a low voltage condition to a high voltage condition. Specifically, as the conduction of transistor 205 decreases, the conduction of field effect transistor 230 correspondingly decreases, producing a lower voltage at gate electrode 237 of transistor 235 which interrupts its conduction and switches transistor 235 to a nonconducting state which raises output voltage 62.

As a result, the differential action of transistors 200 and 205 together with their respective switching circuits maintain both outputs 61 and 62 in low voltage conditions until the error voltage applied exceeds a predetermined threshold. Thereafter, the corresponding switching circuit is operative to raise either output 61 or output 62 to a high voltage signal condition indicative of the direction of error voltage change. While the manner in which the remainder of the system interprets or responds to the voltage conditions of outputs 61 and 62 of the present invention threshold detection system is a matter of design choice, the system shown in FIG. 3 has been configured such that a high voltage condition at output 61 is indicative of an oscillator low frequency error while a high voltage at output 62 is indicative of an oscillator high frequency error. It will be apparent to those skilled in the art, however, that with appropriate phase detector changes and the like, the reverse interpretation may be used.

The combined effect of the frequency responsive gain error amplifier and threshold detecting system of the circuit shown in FIG. 4 facilitates the design of a linearized phase locked loop which substantially maintains a consistent and predictable system response to frequency and phase errors while operating over a broad spectrum of scan frequencies. The system further facilitates the detection of significant oscillator frequency errors as well as the direction of frequency error and provides the basic input which may be utilized by a long term phase error correction system to configure the free-running or static frequency of the scan oscillator in accordance with the desired scan frequency and avoid the continued presence of large magnitude frequency corrections. In addition, the use of a frequency dependent gain control of the present invention error amplifier increases the dynamic range for the error amplifier further enhancing system performance particularly in a multiple frequency scan control system.

In summary, therefore, the circuit of FIG. 4 may be divided into three basic differential amplifiers shown in dashed line boxes 300, 310 and 320. It is desirable to maintain the automatic phase control at a fraction of horizontal oscillator bias current.

It is further desired that the phase detector output voltage range for the automatic phase control be a constant factor (K) larger than that required by the comparator determining excessive error in the oscillator. In the system shown, this constant is determined by the voltage drop across resistors 179 and 184, caused by the current from current source 165.

In a multiple scan frequency monitor, the free running frequency of the scan oscillator must be controlled or changed in response to the scan sync horizontal signal frequency. Therefore, the oscillator bias current must change as required by the sync frequency, and thus can not be used as a means of producing the voltage drop across resistors 179 and 184.

It should be noted that the phase detector output signal is amplified by extended range differential amplifier 300 while the same signal is amplified by the normal range differential amplifier 310. Therefore, differential amplifier 310 will achieve limiting at a much lower phase detector signal amplitude than differential amplifier 300.

Normal range differential amplifier 320 is used to amplify the phase detector output signal received via differential amplifier 300 which controls the horizontal scan oscillator frequency and phase.

The differential amplifier 300 receives the phase detector output signal from the junction of resistors 90 and 91 and capacitor 92. In contrast, differential amplifier 310 receives the phase detector output signal from the junction of resistor 91 and capacitor 93. As a result, the amplifiers are driven through different time constant networks.

Specifically, the phase detector output signal applied to differential amplifier 300 is "faster" or more responsive to short term changes than the signal applied to differential amplifier 310. This faster time constant for differential amplifier 300 maintains the phase control of the horizontal scan oscillator at a faster speed while the frequency control used for long term average is more suitable for static phase error correction.

While particular embodiments of the invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention.

That which is claimed is:

1. For use in an oscillator system having a reference frequency, an oscillator exhibiting an oscillator frequency, and an oscillator control comparing said oscillator frequency to said reference frequency and producing a comparison-related error signal, an error signal amplifier comprising:
    amplifying means for amplifying said error signal having a variable signal gain;
    frequency bias means for varying said amplifier gain in response to a control signal related to said reference frequency; and
    threshold means responsive to said error signal in excess of a predetermined amplitude to produce an output signal indicative of large magnitude oscillator frequency errors.

2. An error signal amplifier as set forth in claim 1 wherein said oscillator defines a frequency-dependent nonlinear response to said error signal and wherein said control signal varies said signal gain in a compensating substantially inverse frequency-dependent manner to linearize said oscillator control.

3. An error signal amplifier as set forth in claim 2 wherein said amplifying means include a first differential amplifier having a constant current source and wherein said frequency bias means include a second differential amplifier having inputs coupled to said first differential amplifier and having a variable current source responsive to said control signal.

4. An error signal amplifier as set forth in claim 3 wherein said threshold means include:
    a third differential amplifier having an input and a pair of differential outputs;
    first and second threshold switches coupled to said differential outputs; and
    means for applying said error signal to said input of said third differential amplifier.

5. For use in a phase locked loop control system having an oscillator defining a nonlinear frequency-dependent error signal response characteristic, a phase detector for comparing the frequency and phase of said oscillator to a reference sync signal and for producing a corresponding error signal, and filter means for coupling said error signal to an error signal amplifier, said error signal amplifier comprising:
    amplifying means having a variable signal gain interposed between said filter means and said phase detector;
    frequency range means for producing a frequency-indicative signal related to the frequency of said reference sync signal; and
    bias means for varying said signal gain of said amplifying means in response to said frequency-indicative signal to establish a signal gain for said amplifying means which tends to compensate for said error signal response characteristic of said oscillator.

6. An error signal amplifier as set forth in claim 5 further including:
    threshold means responsive to said error signal for producing an output signal indicative of error signal magnitudes less than or greater than a predetermined amplitude range.

7. An error signal amplifier as set forth in claim 6 wherein said amplifying means include:
    a first differential amplifier having a first pair of differential inputs, a common constant current source and a first pair of differential outputs; and
    a second differential amplifier having a second pair of inputs coupled to said first pair of outputs, a second pair of outputs one of which is coupled to said oscillator, and a common variable current source.

8. An error signal amplifier as set forth in claim 7 wherein said bias means include means for coupling at least a portion of said frequency-indicative signal to said common variable current source.

* * * * *